United States Patent [19]

Ditchek

[11] Patent Number: 4,755,256

[45] Date of Patent: Jul. 5, 1988

[54] METHOD OF PRODUCING SMALL CONDUCTIVE MEMBERS ON A SUBSTRATE

[75] Inventor: Brian M. Ditchek, Milford, Mass.

[73] Assignee: GTE Laboratories Incorporated, Waltham, Mass.

[21] Appl. No.: 611,307

[22] Filed: May 17, 1984

[51] Int. Cl.⁴ .............. C30B 13/21; C30B 21/02; C30B 29/10

[52] U.S. Cl. .............. 156/620.71; 156/620.72; 156/620.73; 156/604; 156/616.1; 156/DIG. 64; 156/DIG. 80; 156/DIG. 73; 427/126.1; 437/99; 437/170; 437/173; 428/700; 428/620; 428/623

[58] Field of Search ............ 156/617 R, DIG. 64, 156/DIG. 80, DIG. 102, DIG. 73; 427/93, 95

[56] References Cited

U.S. PATENT DOCUMENTS

| | | | |
|---|---|---|---|
| 4,461,070 | 7/1984 | Cline | 29/571 |
| 4,477,324 | 10/1984 | Cline | 204/129.1 |
| 4,496,634 | 1/1985 | Cline | 428/611 |
| 4,500,609 | 2/1985 | Cline | 428/610 |

OTHER PUBLICATIONS

Busch et al, Appl. Phys. Lett. 41(4), 8/82 363-364.
Albers et al, J. Crystal Growth 18(1973) pp. 147-150.
Cline, J. Appl. Physics 52 (1981) pp. 256-261.
Cline, J. Appl. Physics 53(7) pp. 4896-4902.

Primary Examiner—Gary P. Straub
Attorney, Agent, or Firm—David M. Keay

[57] ABSTRACT

Method of forming alternating narrow strips of conductive metal silicide, specifically cobalt disilicide, and silicon on a substrate as of silicon with a silicon dioxide or silicon nitride surface layer. Cobalt and silicon are deposited on the substrate in the mole ratio of the eutectic composition of cobalt disilicide and silicon. A molten zone is caused to traverse these materials which upon resolidification at the trailing edge of the molten zone segregate into the two eutectic phases forming alternating narrow strata or lamellae of cobalt disilicide and silicon.

4 Claims, 1 Drawing Sheet

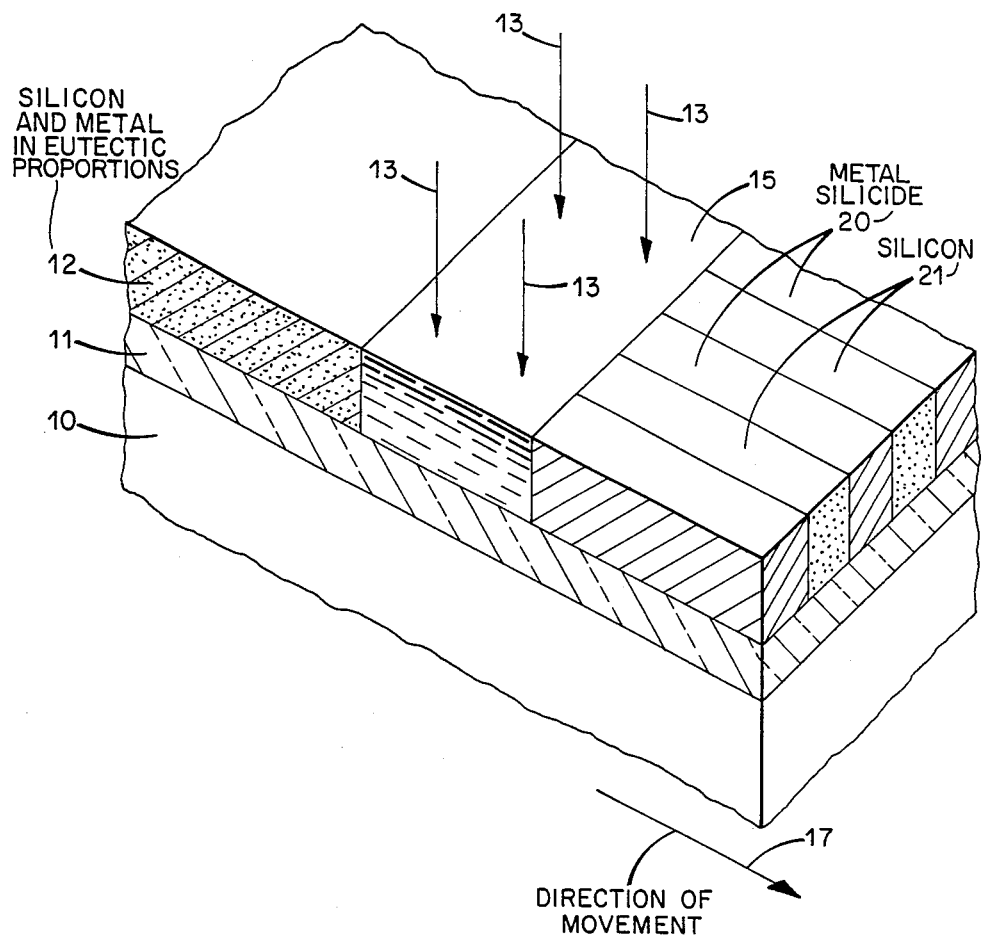

METHOD OF PRODUCING SMALL CONDUCTIVE MEMBERS ON A SUBSTRATE

BACKGROUND OF THE INVENTION

This invention relates to conductive members on substrates. More particularly, it is concerned with methods of producing small, closely spaced conductive members in integrated circuit structures.

The miniaturization of electronic components in semiconductor integrated circuit structures has advanced at a rapid rate. The conductive elements of components and the conductive interconnections and the spacing between conductive interconnections must be made relatively small in order to accommodate an increased density of components with respect to surface area of integrated circuit substrates. The dimensions and spacing of conductive members have been defined by photolithographic techniques and hence are limited by the tolerances permitted by the use of these techniques. It is desirable that the dimensions of conductive members and the spacing between them be of the order of one micron or less in order to provide for increased component density in integrated circuit structure.

SUMMARY OF THE INVENTION

The method in accordance with the present invention for producing small conductive members on a substrate comprises providing a substrate and depositing silicon and a material on the surface of the substrate to form a layer. The material is selected from the group consisting of a metal the silicide of which forms a eutectic composition with silicon, the silicide of the metal, and mixtures thereof. The mole ratio of silicon to the metal which is present in the layer is approximately equal to the mole ratio of silicon to the metal in the eutectic composition. Heat is applied to establish a molten zone in the layer, and the molten zone is caused to traverse a portion of the layer. The portion of the layer traversed by the molten zone resolidifies into lamellae or alternating continuous strips of silicon and the silicide of the metal. The resulting structure is an array of parallel, small conductive members of a conductive metal silicide which are separated by narrow strips of silicon. The silicon can be removed by preferential etching procedures to provide an array of thin conductive members for elements of semiconductor components and for interconnections between elements of semiconductor components in an integrated circuit structure.

BRIEF DESCRIPTION OF THE DRAWING

The sole FIGURE of the drawing is a representation of a portion of an integrated circuit structure illustrating the fabrication of small conductive members in accordance with the method of the present invention.

For a better understanding of the present invention, together with other and further objects, advantages, and capabilities thereof, reference is made to the following discussion and appended claims in connection with the above-described drawing.

DETAILED DESCRIPTION OF THE INVENTION

The sole FIGURE of the drawing is a representation illustrating a portion of an integrated circuit structure including a substrate which may include a body 10 as of silicon covered with an adherent insulating layer 11 as of silicon dioxide or silicon nitride. In accordance with the method of the present invention a region of the substrate at the surface is coated with a layer 12 which contains silicon and also a metal the silicide of which forms a eutectic composition with silicon.

The layer 12 may be constituted of a film of the metal and an overlying film of silicon. Alternatively, the layer 12 may include a mixture of silicon and the metal which are deposited simultaneously as by sputtering techniques. Also, the metal may be deposited in elemental form or as the silicide of the metal. In any event the resulting layer 12 contains metal and silicon in the mole relationship of the eutectic composition of the metal silicide and silicon.

After the layer 12 containing the metal either as the metal or as the silicide of the metal and the silicon has been deposited, the assembly may be subjected to an annealing step at a temperature which is below that of the melting point of the eutectic composition. Such an annealing step reduces the reflectivity of the surface of the layer 12 and provides a more intimate mixture of the constituents of the layer 12.

Heat energy as indicated by arrows 13 is then applied to an area on the surface of the layer 12 as by a laser to raise its temperature to above the melting point of the eutectic composition and produce a molten zone 15 in the layer. The molten zone is carefully controlled as to size. The molten zone is caused to traverse a portion of the layer 12 by effecting relative motion between the source of heat and the assembly. As illustrated in the FIGURE the assembly is moved along the direction indicated by the arrow 17. As is well understood this relative movement imparted to the assembly with respect to the heat source causes the molten zone to traverse a portion of the layer 12 with the constituents melting at the forward edge and resolidifying at the trailing edge.

It has been found that the process of directional solidification as described causes the constituents of the layer 12 to segregate upon resolidification into the two eutectic phases forming narrow alternating strata or lamellae of the metal silicide 20 and silicon 21 as illustrated in the FIGURE. The metal silicide 20 and the silicon 21 are both of single crystal structure. In order to form the alternating pattern as shown in the FIGURE with the narrow strips of the metal silicide 20 and of silicon 21 contiguous the underlying substrate, the layer 12 should be thin, no thicker than about 2 microns. The period of the lamellae $\lambda$ is related to the velocity of the solid-liquid interface at the resolidification edge of the molten zone $v$ by the relationship $\lambda = K v^{-\frac{1}{2}}$ where K is a constant for the particular constituent system. Thus it can be seen that the conductive members, or wires, of metal silicide can be made thinner, or finer, by increasing the velocity of traverse.

One eutectic system which is particularly useful in the art of semiconductor integrated circuit structures is silicon-cobalt disilicide ($CoSi_2$) Cobalt disilicide has a cubic structure and is lattice matched with silicon within 1.2%. Other useful metals having silicides which form eutectic compositions with silicon include tantalum, titanium, tungsten, platinum, chromium, and niobium.

As a specific example, silicon wafers 10 were provided with a thermally grown silicon dioxide layer 11 1.7 microns thick. A film of polycrystalline silicon 0.5 micron thick was deposited on the surface of the oxide layer by conventional chemical vapor deposition techniques. A film of cobalt 0.14 micron thick was deposited on the silicon film by known electron beam evaporation techniques. The mole ratio of silicon to cobalt in the layer 12 thus produced was approximately equal to the mole ratio of the eutectic composition of Si-$CoSi_2$. The eutectic composition is 77.5 atomic % silicon or 62.2 weight % silicon, the remainder being cobalt.

The resulting assembly was annealed in argon at a temperature of 700° C. for a period of four hours to form a more intimate mixture of the silicon and cobalt and to reduce the reflectivity of the surface. The layer of films was then heated by using a 2.5 watt argon ion laser with the beam focused to an area 20 microns in diameter. The molten zone 15 produced was approximately 10 microns wide. (The melting point of the Si-$CoSi_2$ eutectic composition is 1259° C.) The wafer was then moved with respect to the laser beam as indicated by the arrow in the FIGURE at a rate of 0.13 cm/sec. The lamellae of cobalt disilicide 20 and silicon 21 formed had a period of 0.5 micron; that is, the conductive members 20 of single crystal cobalt disilicide and the intervening strips 21 of single crystal silicon were each approximately 0.25 micron wide. Under the same conditions except for the traversing or scanning rate which was increased to 8 cm/sec, the lamellae of cobalt disilicide and silicon had a period of 0.075 micron. Thus, extremely small strata or lamellae of the silicide and silicon can be formed depending upon the speed of traverse of the molten zone. The conditions should be such, however, to ensure that a state of equilibrium of the silicide and the metal exists at the trailing edge, or resolidification front, of the molten zone.

While there has been shown and described what is considered a preferred embodiment of the present invention, it will be obvious to those skilled in the art that various changes and modifications may be made therein without departing from the invention as defined by the appended claims.

What is claimed is:

1. The method of producing small conductive members on a substrate comprising providing a substrate having a surface;

depositing silicon and a material on the surface of the substrate to form a layer; said material being selected from the group consisting of a metal a silicide of which forms a eutectic composition with silicon, the silicide of said metal which forms the eutectic composition with silicon, and mixtures thereof; the mole ratio of silicon to the metal present in the layer being approximately equal to the mole ratio of silicon to the metal in the eutectic composition of the silicide of said metal which forms the eutectic composition with silicon and silicon;

heating an area on the surface of said layer to a temperature above the melting point of the eutectic composition of the silicide of said metal which forms the eutectic composition with silicon and silicon to establish a molten zone in said layer; and causing the molten zone to tranverse a portion of said layer whereby the portion of said layer traversed by the molten zone resolidifies into alternating strips of silicon and the silicide of said metal which forms the eutectic composition with silicon;

wherein silicon and said material are deposited in alternate films to form said layer; and including prior to heating to establish a molten zone the step of annealing the silicon and material of said layer to form a more intimate mixture of silicon and the material in said layer and to reduce the surface reflectivity of said layer.

2. The method in accordance with claim 1 wherein said layer is less than approximately 2 microns thick.

3. The method of producing small conductive members on a substrate comprising providing a substrate having a surface;

depositing silicon and a material on the surface of the substrate to form a layer; said material being selected from the group consisting of cobalt, cobalt disilicide, and mixtures thereof; the mole ratio of silicon to cobalt present in the layer being approximately equal to the mole ratio of silicon to cobalt in the eutectic composition of cobalt disilicide and silicon;

heating an area on the surface of said layer to a temperature above the melting point of the eutectic composition of cobalt disilicide and cobalt to establish a molten zone in said layer; and causing the molten zone to traverse a portion of said layer, the portion of said layer traversed by the molten zone resolidifying into alternate strips of single crystal silicon and single crystal cobalt disilicide;

wherein silicon and said material are deposited in alternate films to form said layer; and including prior to heating to establish a molten zone the step of annealing the silicon and material of said layer to form a more intimate mixture of silicon and the material in said layer and to reduce the surface reflectivity of said layer.

4. The method in accordance with claim 3 wherein said layer is less than approximately 2 microns thick.

* * * * *